(12) United States Patent
Furukawa et al.

(10) Patent No.: US 7,579,272 B2
(45) Date of Patent: Aug. 25, 2009

(54) METHODS OF FORMING LOW-K DIELECTRIC LAYERS CONTAINING CARBON NANOSTRUCTURES

(75) Inventors: Toshiharu Furukawa, Essex Junction, VT (US); Mark Charles Hakey, Fairfax, VT (US); Steven John Holmes, Guilderland, NY (US); David Vaclav Horak, Essex Junction, VT (US); Charles William Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 294 days.

(21) Appl. No.: 11/670,778

(22) Filed: Feb. 2, 2007

(65) Prior Publication Data
US 2007/0123028 A1    May 31, 2007

Related U.S. Application Data (62) Division of application No. 10/711,764, filed on Oct. 4, 2004, now Pat. No. 7,233,071.

(51) Int. Cl.
*H01L 21/4763* (2006.01)
(52) U.S. Cl. ........... 438/643; 257/759; 257/E51.04; 257/E21.575
(58) Field of Classification Search ............ 438/643, 438/658; 257/E51.04, E21.575
See application file for complete search history.

(56) References Cited

U.S. PATENT DOCUMENTS

| | | |
|---|---|---|
| 5,227,038 A | 7/1993 | Smalley et al. |
| 5,300,203 A | 4/1994 | Smalley |
| 5,796,573 A | 8/1998 | Kotecki et al. |
| 6,250,984 B1 | 6/2001 | Jin et al. |
| 6,323,555 B1 | 11/2001 | Maex et al. |
| 6,361,861 B2 | 3/2002 | Gao et al. |
| 6,423,583 B1 | 7/2002 | Avouris et al. |
| 6,515,325 B1 | 2/2003 | Farnworth et al. |
| 6,645,455 B2 | 11/2003 | Margrave et al. |
| 6,706,402 B2 | 3/2004 | Rueckes et al. |
| 6,706,566 B2 | 3/2004 | Avouris et al. |
| 6,790,790 B1 | 9/2004 | Lyons et al. |
| 6,837,928 B1 | 1/2005 | Zhang et al. |
| 6,858,891 B2 | 2/2005 | Farnworth et al. |

(Continued)

OTHER PUBLICATIONS

Collins, Phillip G. et al., "Engineering Carbon Nanotubes and Nanotube Circuits Using Electrical Breakdown," Science, vol. 292, pp. 706-709, Apr. 27, 2001.

(Continued)

*Primary Examiner*—Michelle Estrada
*Assistant Examiner*—Jarrett J Stark
(74) *Attorney, Agent, or Firm*—Wood, Herron & Evans, LLP (57) ABSTRACT

Methods of forming low-k dielectric layers for use in the manufacture of semiconductor devices and fabricating semiconductor structures using the low-k dielectric material. The low-k dielectric material comprises carbon nanostructures, like carbon nanotubes or carbon buckyballs, that are characterized by an insulating electronic state. The carbon nanostructures may be converted to the insulating electronic state either before or after a layer containing the carbon nanostructures is formed on a substrate. One approach for converting the carbon nanostructures to the insulating electronic state is fluorination.

8 Claims, 9 Drawing Sheets

U.S. PATENT DOCUMENTS

| | | | |
|---|---|---|---|
| 6,891,227 | B2 | 5/2005 | Appenzeller et al. |
| 6,930,343 | B2 | 8/2005 | Choi et al. |
| 7,011,771 | B2 | 3/2006 | Gao et al. |
| 2002/0001905 | A1 | 1/2002 | Choi et al. |
| 2002/0086124 | A1 | 7/2002 | Margrave et al. |
| 2002/0130407 | A1 | 9/2002 | Dahl et al. |
| 2002/0155722 | A1 | 10/2002 | Satta et al. |
| 2003/0132461 | A1 | 7/2003 | Roesner et al. |
| 2003/0168683 | A1 | 9/2003 | Farnworth et al. |
| 2003/0170930 | A1 | 9/2003 | Choi et al. |
| 2003/0178617 | A1 | 9/2003 | Appenzeller et al. |
| 2003/0211724 | A1 | 11/2003 | Haase |
| 2003/0230760 | A1 | 12/2003 | Choi et al. |
| 2004/0018138 | A1 | 1/2004 | Hirata |
| 2004/0169281 | A1 | 9/2004 | Nguyen et al. |
| 2004/0223900 | A1 | 11/2004 | Khabashesku et al. |
| 2005/0002851 | A1 | 1/2005 | McElrath et al. |
| 2005/0062034 | A1 | 3/2005 | Dubin |
| 2005/0089684 | A1 | 4/2005 | Barron et al. |
| 2005/0129948 | A1 | 6/2005 | Furukawa et al. |
| 2005/0130341 | A1 | 6/2005 | Furukawa et al. |
| 2005/0167655 | A1 | 8/2005 | Furukawa et al. |
| 2005/0167740 | A1 | 8/2005 | Furukawa et al. |
| 2005/0167755 | A1 | 8/2005 | Dubin et al. |
| 2005/0179029 | A1 | 8/2005 | Furukawa et al. |
| 2005/0186378 | A1 | 8/2005 | Bhatt |
| 2005/0224888 | A1 | 10/2005 | Graham et al. |
| 2006/0118975 | A1 | 6/2006 | Koenenkamp |
| 2006/0192231 | A1 | 8/2006 | Nihei |

OTHER PUBLICATIONS

Ren, Z.F. et al. "Large Arrays of Well-Aligned Carbon Nanotubes", Proceedings of 13th International Winter School on Electronic Properties of Novel Materials, p. 263-267, Feb. 27-Mar. 6, 1999, Kirchberg/Tirol, Austria.

Plonjes, Elke et al., "Synthesis of Single-Walled Carbon Nanotubes in Vibrationally Non-Equilibrium Carbon Monoxide", Chemical Physics Letters 352 (2002) pp. 342-247.

Teo, Kenneth B. K., et al, "Catalytic Synthesis of Carbon Nanotubes and Nanofibers", Encyclopedia of Nanoscience and Nanotechnology, vol. X, pp. 1-22, copyright 2003.

Harris, P. "Carbon Nanotubes and Related Structures", Cambridge University Press 1999, pp. 15-60.

Duesberg, Georg S. et al., "Large-Scale Integration of Carbon Nanotubes Into Silicon Based Microelectronics", Proceedings of the SPIE, Bellingham, VA, vol. 5118, May 21, 2003, pp. 125-137.

Battelle No. 12132, "Carbon Nanotube Arrays: Synthesis of Dense Arrays of Well-Aligned Carbon Nanotubes Completely Filled with Titanium Carbide on Titanium Substrates", Mar. 2003 (1 page).

Chang, Aileen et al, "Integration of Nanotubes into Devices", National Nanofabrication Users Network, p. 58, Stanford Nanofabrication Facility.

Bahr, Jeffrey L. et al., "Covalent Chemistry of Single-Wall Carbon Nanotubes", J. Mater. Chem. 2002. 12. pp. 1952-1958.

Mickelson, E.T. et al., "Fluorination of Single-Wall Carbon Nanotubes", Chemical Physics Letters 296 (1998), pp. 188-194

Cao, Anyuan et al., "Direction-Selective and Length-Tunable In-Plane Growth of Carbon Nanotubes", Adv. Mater. 2003, 15, No. 13, Jul. 4, pp. 1105-1109.

Michelson E.T. et al., "Solvation of Fluorinated Single-Wall Carbon Nanotubes in Alcohol Solvents", J. Phys. Chem. B, vol. 103, No. 21 (1999) pp. 4318-4322.

Boul, P.J. et al., "Reversible Sidewall Functionalization of Buckytubes", Chemical Physics Letters, Sep. 3, 1999, pp. 367-372.

Zhao, Ye et al, "Film Growth of Pillars of Multi-Walled Carbon Nanotubes", J.Phys.: Condens, Matter 15 (2003) pp. L565-L569.

Zhang, Yuegang et al, "Electric-Field-Directed Growth of Aligned Single-Walled Carbon Nanotubes", Applied Physics Letters, vol. 79, No. 19, Nov. 5, 2001, pp. 3155-3157.

http://nepp.nasa.gov/index_nasa.cfm/769/"Carbon Nanotubes: Launching a Revolution in Nanotechnology" 7 pages.

Kiang, Ching-Hwa "Growth of Larger-Diameter Single-Walled Carbon Nanotubes," J.Phys. Chem. A 2000, 104, pp. 2454-2456.

Ploenjes, Elke et al, "Single-Walled Carbon Nanotube Synthesis in CO Laser Pumped Monoxide Plasmas" Oct. 10, 2001, 1 page.

Mo, Y.H. et al, "The Growth Mechanism of Carbon Nanotubes From Thermal Cracking of Acetylene Over Nickel Catalyst Supported on Alumina." Synthetic Metals 122 (2001) pp. 443-447.

Jung, Minjae et al, "Growth of Carbon Nanotubes by Chemical Vapor Deposition," Diamond and Related Materials 10 (2001) pp. 1235-1240.

Zhu, H.W. et al, "Direct Synthesis of Long Single-Walled Carbon Nanotube Strands," May 3, 2002, vol. 296, Science pp. 884-886.

Cui, H et al, "Growth Behavior of Carbon Nanotubes on Multilayered Metal Catalyst Film in Chemical Vapor Deposition." Chemical Physics Letters 374 (2003) pp. 222-228.

Li, J et al, "Highly-Ordered Carbon Nanotube Arrays for Electronics Applications" Applied Physics Letters, vol. 75, No. 3, Jul. 19, 1999, pp. 367-369.

Derycke, V et al., "Carbon Nanotube Inter- and Intramolecular Logic Gates," Nano Letters, xxxx vol. 0, No. 0 A-D, American Chemical Society, (Received Aug. 16, 2001) 4 pages.

Wind, S.J. et al. "Vertical Scaling of Carbon Nanotube Field-Effect Transistors Using Top Gate Electrodes," Applied Physics Letters, vol. 80, No. 20, May 20, 2002, pp. 3817-3819.

Z.F.Ren, "Growth, Characterization, and Potential Applications of Periodic Carbon Nanotube Arrays", Dept of Physics, Boston College, Updated 2001, 2 pages.

Popov, V.N. "Carbon Nanotubes: Properties and Application", Materials Science and Engineering, R. vol. R43, No. 3, pp. 61-102 (Jan. 15, 2004) (Summary only) 1 page.

Li, Jun et al, "Bottom-up Approach for Carbon Nonotube Interconnects", NASA Ames Research Center, Moffett Field, CA. Rec'd Dec. 5, 2002, accepted Jan. 31, 2003, 1 page.

Cao, Anyuan et al, "Grapevine-Like Growth of Single Walled Carbon Nanotubes Among Vertically Aligned Multiwalled Nanotube Arrays", Applied Physics Letters, vol. 79, No. 9, Aug. 27, 2001, pp. 1252-1254.

Huang, Z.P. et al "Growth of Highly Oriented Carbon Nanotubes by Plasma-Enhanced Hot Filament Chemical Vapor Deposition." Applied Physics Letters, vol. 73, No. 26, Dec. 28, 1998, pp. 3845-3847.

Ren, Z.F. et al, "Synthesis of Large Arrays of Well-Aligned Carbon Nanotubes on Glass", Science, vol. 282, Nov. 6, 1998, pp. 1105-1107.

Zheng, Bo et al, "Efficient CVD Growth of Single-Walled Carbon Nanotubes on Surfaces Using Carbon Monoxide Precusor", Nano Letters, xxxx vol. 0, No. 0 A-D. American Chemical Society revised Jun. 26, 2002, 3 pages.

Gorman, Jessica, "Nanoscale Networks: Superlong Nanotubes Can Form a Grid" Science News Online, May 3, 2003; vol. 163, No. 18, 3 pages.

"Tiny Nanotubes Set New Record", Aug. 7, 2003. Nanotechweb.org, 1 page.

"IBM Scientists Develop Carbon Nanotube Transistor Technology," IBM.com News—news report concerning work published in Science, vol. 292, Issue 5517, Apr. 27, 2001 entitled "Engineering Carbon Nanotubes and Nanotube Circuits Using Electrical Breakdown", 3 pages.

Choi, Won Bong et al, "Ultrahigh-Density Nanotransistors by Using Selectively Grown Vertical Carbon Nanotubes", Applied Physics Letters, vol. 79, No. 22, Nov. 26, 2001, pp. 3696-3698.

Collins, Phillip G. et al., "Nanotubes for Electronics," Scientific American, pp. 62-69, Dec. 2000.

Collins, Phillip G. et al., "Engineering Carbon Nanotubes and Nanotube Circuits Using Electrical Breakdown," Science, vol. 292, pp. 706-709, Apr. 27, 2001.

Ren, Z.F. et al. "Large Arrays of Well-Aligned Carbon Nanotubes", Proceedings of 13th International Winter School on Electronic Properties of Novel Materials, p. 263-267, Feb. 27-Mar. 6, 1999, Kirchberg / Tirol, Austria.

Plonjes, Elke et al., "Synthesis of Single-Walled Carbon Nanotubes in Vibrationally Non-Equilibrium Carbon Monoxide", Chemical Physics Letters 352 (2002) pp. 342-247.

Teo, Kenneth B. K., et al, "Catalytic Synthesis of Carbon Nanotubes and Nanofibers", Encyclopedia of Nanoscience and Nanotechnology, vol. X, pp. 1-22, copyright 2003.

Harris, P. "Carbon Nanotubes and Related Structures", Cambridge University Press 1999, pp. 15-60.

Duesberg, Georg S. et al., "Large-Scale Integration of Carbon Nanotubes Into Silicon Based Microelectronics", Proceedings of the SPIE, Bellingham, VA, vol. 5118, May 21, 2003, pp. 125-137.

Battelle No. 12132, "Carbon Nanotube Arrays: Synthesis of Dense Arrays of Well-Aligned Carbon Nanotubes Completely Filled with Titanium Carbide on Titanium Substrates", Mar. 2003 (1 page).

METHODS OF FORMING LOW-K DIELECTRIC LAYERS CONTAINING CARBON NANOSTRUCTURES

Cross-Reference to Related Applications

This application is a divisional of application Ser. No. 10/711,764, filed Oct. 4, 2004 now U.S. Pat. No. 7,233,071, which is hereby incorporated by reference herein in its entirety.

FIELD OF THE INVENTION

The invention relates generally to semiconductor device fabrication and, more particularly, to methods for forming integrated circuit structures.

BACKGROUND OF THE INVENTION

Progressive miniaturization of feature sizes in circuit elements has improved the performance and increased the functional capability of integrated circuits (IC's). Back-end-of-line (BEOL) multilevel interconnect structures have been developed that complement advances in circuit element density realized by size reductions by more effectively routing signal paths between the constituent circuit elements of the IC. Circuit performance and functional capability of the circuit elements are eventually limited by the signal-transmission effectiveness and efficiency of the BEOL interconnect structure.

Damascene processes are routinely used to fabricate such BEOL multilevel interconnect structures. In a single damascene process, vias are etched in a patterned layer of dielectric material and filled with metal to establish interlevel contacts with a lower conductor. The lower conductor may be the metallization lines of an underlying level of the interconnect structure. Trenches are then etched in another patterned layer of dielectric material and filled with metal to define intralevel metallization lines. In a dual-damascene process, trenches and vias are etched in a patterned layer of dielectric material and filled simultaneously by a single blanket deposition of metal. In single and dual-damascene processes, any excess overburden of metal on the dielectric layer is removed from the top of the structure in a planarization process, such as chemical mechanical polishing (CMP). Silicon oxide and fluorine-doped silicon glass (FSG) are common materials used to form the dielectric layer(s).

Increases in circuit element density as achieved by reducing the line-to-line spacings between adjacent, on-pitch metallization lines in each interconnect level and between metallization lines in adjacent interconnect levels. The reduction in line-to-line spacing serves to increase the line-to-line capacitance, which causes propagation delay by slowing the speed of the signals carried by the metallization lines, and results in cross talk noise. This increase in line-to-line capacitance may be offset by reducing the dielectric constant of the dielectric material constituting the dielectric layer(s). Conversely, a reduction in line-to-line capacitance by reducing the dielectric constant permits concomitant reductions in line-to-line spacing.

The reduction or elimination of these adverse capacitive couplings could advantageously lead to enhanced device speed and reduced power consumption. Consequently, a trend in interconnect structures is to form the dielectric layer from a dielectric material characterized by a relative permittivity or dielectric constant smaller than the dielectric constant of traditional materials. Candidate low-k materials include inorganic polymers, organic polymers such as polyamides and SiLK® from Dow Chemical Company, organo-inorganic materials like spin-on glasses, and silsesquioxane-based materials. Generally, these candidate low-k materials are characterized by a dielectric constant smaller than three (3).

Damascene processes place stringent requirements on the properties of the candidate low-k dielectric materials, which has limited the integration of low-k dielectrics into damascene processes. In particular, a suitable low-k dielectric material must have sufficient mechanical strength and adequate chemical stability to withstand the cleaning, etching, polishing, and thermal treatments imposed by damascene processing. After manufacture, BEOL interconnect structures formed using organic dielectric materials have experienced significant reliability problems resulting from mismatches in the thermal coefficient of expansion with neighboring inorganic materials.

What is needed, therefore, is a low-k dielectric material suitable for use in forming a structure in an integrated circuit, such as for use as a low-k dielectric layer in a BEOL interconnect structure for an integrated circuit, that is fully compatible with processes for forming such interconnect structures.

SUMMARY OF THE INVENTION

In accordance with an embodiment of the invention, a dielectric material for forming a structure of an integrated circuit is comprised of a plurality of carbon nanostructures, such as carbon nanotubes or carbon buckyballs. In one embodiment of the invention, the nanostructures forming the dielectric material may be fluorinated. In another embodiment of the invention, the dielectric material may have a dielectric constant less than about three (3). The dielectric material may be used to form a dielectric layer in a semiconductor structure that includes at least one conductive feature electrically isolated from nearby conductive features by portions of the dielectric layer.

In accordance with another embodiment of the invention, a method for forming a dielectric layer includes forming a dielectric layer comprising a plurality of carbon nanostructures on a substrate. The dielectric layer, which may be applied to the substrate by a spin-on process, may be either formed in an insulating electronic state or converted to the insulating electronic state after formation.

In accordance with another embodiment of the invention, a method for forming a structure for an integrated circuit includes forming a dielectric layer including a plurality of carbon nanostructures on a substrate. The method further includes forming at least one conductive feature in the dielectric layer.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
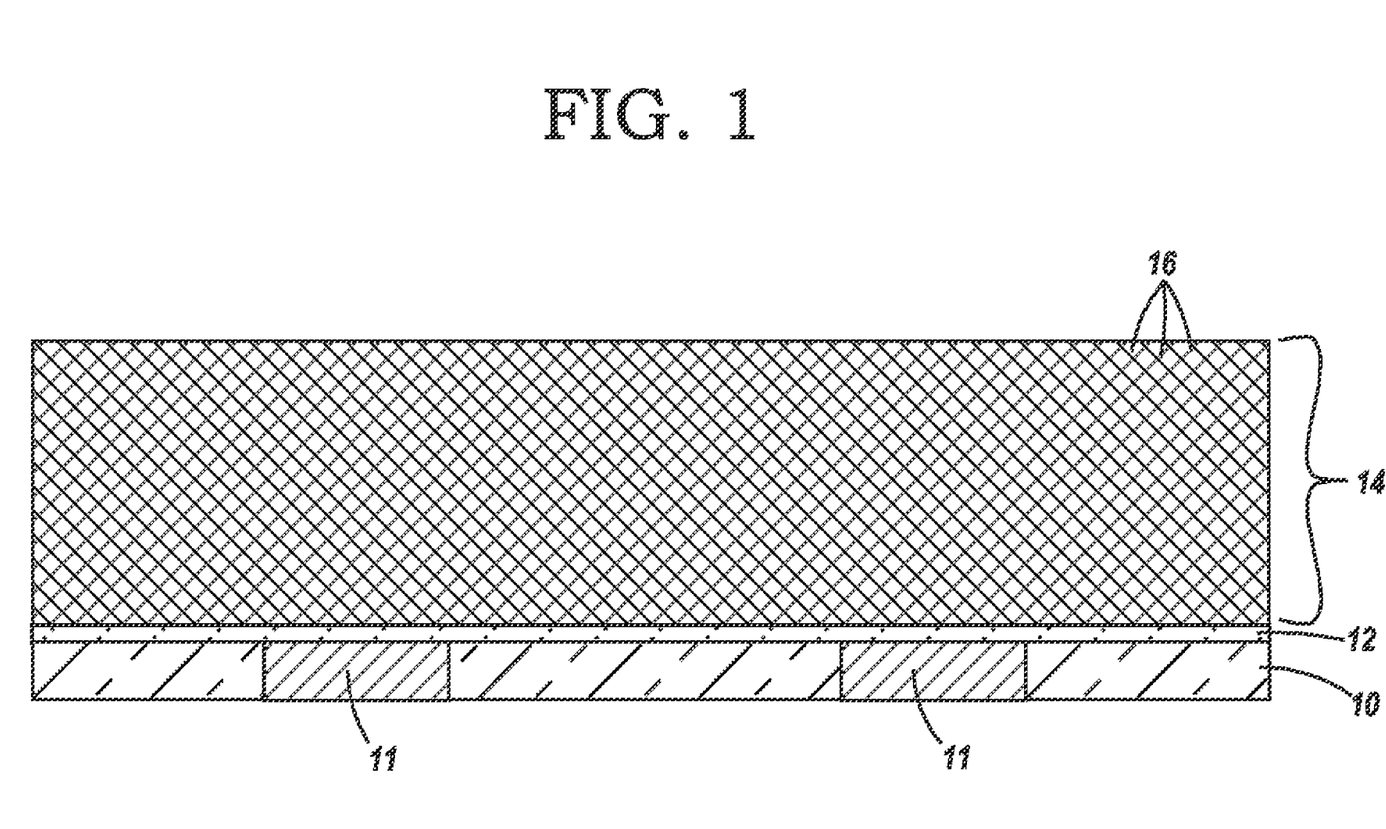
FIGS. 1-7 are diagrammatic cross-sectional views of a portion of a substrate at various stages of a processing method in accordance with an embodiment of the invention.

With reference to FIG. 1, a substrate 10 is covered by a layer 12 of a suitable cap material, such as silicon nitride ($Si_3N_4$). Substrate 10 contains features 11 that are to be contacted, like a silicon diffusion region (e.g., a source or drain for a semiconductor device) or an underlying wiring or metallization structure. Substrate 10 may be a semiconductor wafer composed of any semiconductor material including, but not limited to, silicon (Si), silicon germanium (SiGe), silicon-on-insulator, and other like Si-containing semiconductor materials. The substrate 10 may be doped with either n-type or p-type impurities, depending on the desired device or circuit element to be fabricated, and may contain various isolation and/or device regions either formed in the substrate 10 or on a surface thereof. Substrate 10 may also be one of the interconnect levels of a multilevel interconnect structure, a dielectric material, a buried barrier layer, a metallization line, or another substrate that a person of ordinary skill would recognize as present in integrated circuits.

A layer 14 of a dielectric material overlies the cap layer 12, which promotes adhesion between interlevel dielectric 14 and substrate 10. The dielectric layer 14 is constituted by a network of multiple carbon nanotubes 16 that are individually and collectively characterized by an electrically-insulating electronic state and, hence, are non-conducting of electrical current. The carbon nanotubes 16 of dielectric layer 14 may be applied across substrate 10 in an electrically-insulating electronic state or may be converted to an electrically-insulating electronic state after layer 14 is formed. The precise arrangement and orientation of the carbon nanotubes 16 is not shown in the Figures, which are understood by those of ordinary skill to be diagrammatic. As non-limiting examples, the carbon nanotubes 16 may be randomly oriented, substantially parallel and preferentially aligned, or a tangled mat. Generally, carbon nanotubes 16 are hollow cylindrical tubes formed from precisely-arranged hexagonal rings of bonded carbon atoms. The carbon nanotubes 16 may, without limitation, be multi-wall nanotubes having a structure resembling nested concentric cylinders or, alternatively, may constitute single-wall nanotubes.

In accordance with one embodiment of the invention, dielectric layer 14 may be formed by mixing the carbon nanotubes 16 with a solvent-diluted copolymer and then depositing the mixture in a liquid form across the surface of cap layer 12 by a spin-coating process. To that end, a mixture of the carbon nanotubes 16, the copolymer, and an appropriate solvent, such as an alcohol, is dispensed onto cap layer 12 in a predetermined amount and the substrate 10 is rapidly rotated or spun. The spin-on process uniformly distributes the liquid across the cap layer 12 by centrifugal forces and results in a uniform applied film of a controlled thickness. The liquid film is solidified by a low-temperature hot plate bake that removes residual solvent and cures the copolymer. Typically, the hot plate bake is performed at a temperature of from about 90° C. to about 400° C. for a time period ranging from about 10 seconds to about 300 seconds. The residual copolymer operates as a binder for the carbon nanotubes 16 after the solvent is removed. Suitable spin on organic copolymers include SiLK® sold by Dow Chemical Company, the fluorinated aromatic resin FLARE® sold by Honeywell Electronic Materials, perfluorocyclobutane (PFCB) aromatic ether polymers commercially available from Dow Chemical Company, each of which has a dielectric constant less than about three (3), and other high temperature stable materials such as polyimides. Even if the contribution of the binding copolymer to the effective dielectric constant of dielectric layer 14 is taken into consideration, dielectric layer 14 has a dielectric constant of less than about three (3) when the carbon nanotubes 16 are in the electrically-insulating electronic state, as described below.

In an alternative embodiment of the invention, the dielectric layer 14 may be formed from electrically-insulating $C_{60}$ or $C_{70}$ buckyballs or multi-wall buckyballs, instead of carbon nanotubes 16 or in a mixture with carbon nanotubes 16, that are deposited by spin coating, as described above. Buckyballs typically have a shape resembling a soccer ball with a lattice formed primarily from six-fold rings (hexagonal structure), with occasional five-fold rings and seven-fold rings. Buckyballs may be formed by a conventional process, such as those processes disclosed in U.S. Pat. No. 5,227,038 (Smalley et al.) and U.S. Pat. No. 5,300,203 (Smalley), each of which is hereby incorporated by reference herein in its entirety. The buckyballs are converted to the insulating electronic state by, for example, fluorination, as described herein, so that the buckyballs are non-conducting electrically. The invention contemplates that other types of carbon-based nanostructures similar to carbon nanotubes 16 and carbon buckyballs may be used for forming the dielectric layer 14.

The carbon nanotubes 16 may be converted from their as-applied electronic state to an electrically-insulating electronic state after dielectric layer 14 is formed. In one embodiment of the invention, the conversion to an electrically-insulating electronic state may occur immediately after the dielectric layer 14 is formed. In another embodiment of the invention, the conversion may occur during a subsequent processing stage. Alternatively, the carbon nanotubes 16 may be converted to the electrically-insulating state before the dielectric layer 14 is formed by the spin-on process. The carbon nanotubes 16 may also be grown on substrate 10 in either a semiconducting or conducting electronic state, as described below with regard to FIGS. 8 and 9, and converted to an insulating electronic state. Regardless of the formation technique, the resultant dielectric layer 14 constructed from carbon nanotubes 16 will have a dielectric constant of less than about three (3) when the carbon nanotubes 16 are in the electrically-insulating electronic state.

One approach for converting the carbon nanotubes 16 from a semiconducting or conducting electronic state to an electrically-insulating electronic state involves fluorination. An exemplary conversion process involves exposing the carbon nanotubes 16 to a fluorine-containing atmosphere (e.g., fluorine gas ($F_2$)) at an elevated temperature (e.g., 50° C. to 250° C.) and for a duration sufficient to provide a suitable degree of fluorination. The fluorine-containing atmosphere may be diluted with a gaseous diluent including, but not limited to, nitrogen ($N_2$) and inert gases, such as argon (Ar). Treatment of carbon nanotubes by fluorination at elevated temperatures is disclosed, for example, in Mickelson et al., Chem. Phys. Lett. 296 (1998) pp. 188-194, Bahr et al., J. Mater. Chem. 12 (2002) pp. 1952-1958, Mickelson et al., J. Phys. Chem. B (1999) pp. 4318-4312, Boul et al., Chem. Phys. Lett. 310 (1999) 367-372, and U.S. Pat. No. 6,645,455 (Margrave et al.), each of which is hereby incorporated by reference herein in its entirety. The fluorine-containing gas will permeate the dielectric layer 14 and react with the carbon nanotubes 16 at the elevated temperature to provide the electrically-insulating electronic state. The carbon nanotubes 16 may be fluorinated before being applied by the spin-coating process, immediately after the dielectric layer 14 is formed, or during a subsequent process stage. Alternatively, the carbon nanotubes 16 may be hydrogenated or alkylated to convert to an insulating electronic state.

Figure 2:
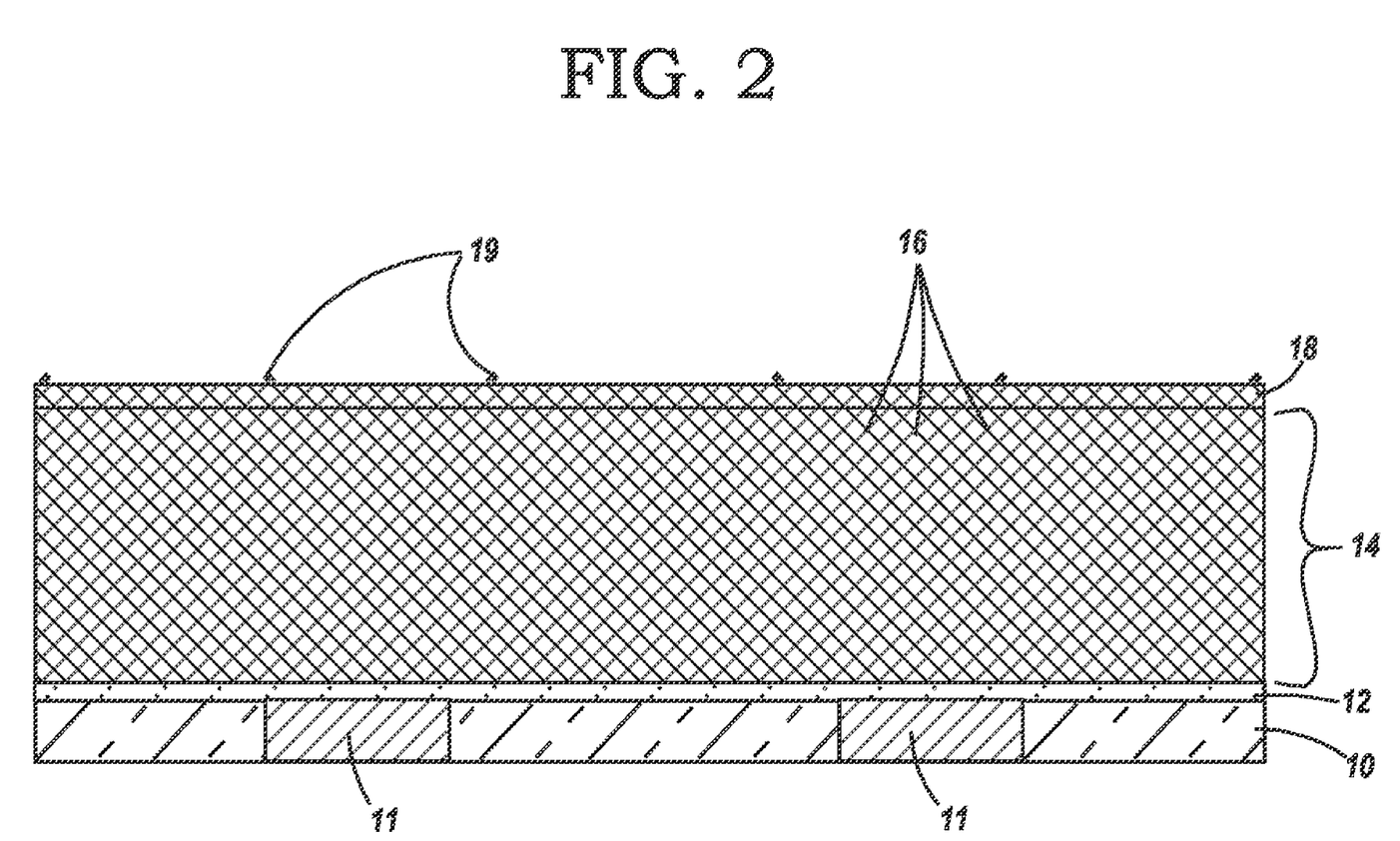

With reference to FIG. 2 in which like reference numerals refer to like features in FIG. 1 and at a subsequent fabrication stage, a cap layer 18 is deposited on the dielectric layer 14. The cap layer 18 operates to seal the upper horizontal surface of the dielectric layer 14 by filling the open spaces or gaps between adjacent carbon nanotubes 16. The cap layer 18 may have an upper boundary that is coplanar with the horizontal upper surface of the dielectric layer 14, as shown in FIG. 2. Alternatively, cap layer 18 may project partially above the horizontal upper surface of dielectric layer 14 or may reside entirely on top of the dielectric layer 14. The tips or free ends of some of the carbon nanotubes 16, of which carbon nanotubes 19 are representative, may project above the horizontal upper surface of cap layer 18. These projecting nanotubes 19 are preferably removed by a planarization technique, such as a chemical-mechanical polishing (CMP) process, so that the upper horizontal surface of cap layer 18 is polished flat and planarized. Any residual metal catalyst exposed by polishing cap layer 18 may be oxidized with an aqueous peroxide wash or with a brief oxygen plasma treatment. This oxidizing step applies to those embodiments of the invention described in FIGS. 8 and 9 in which the dielectric layer 14 is grown using a catalyst.

Figure 3:
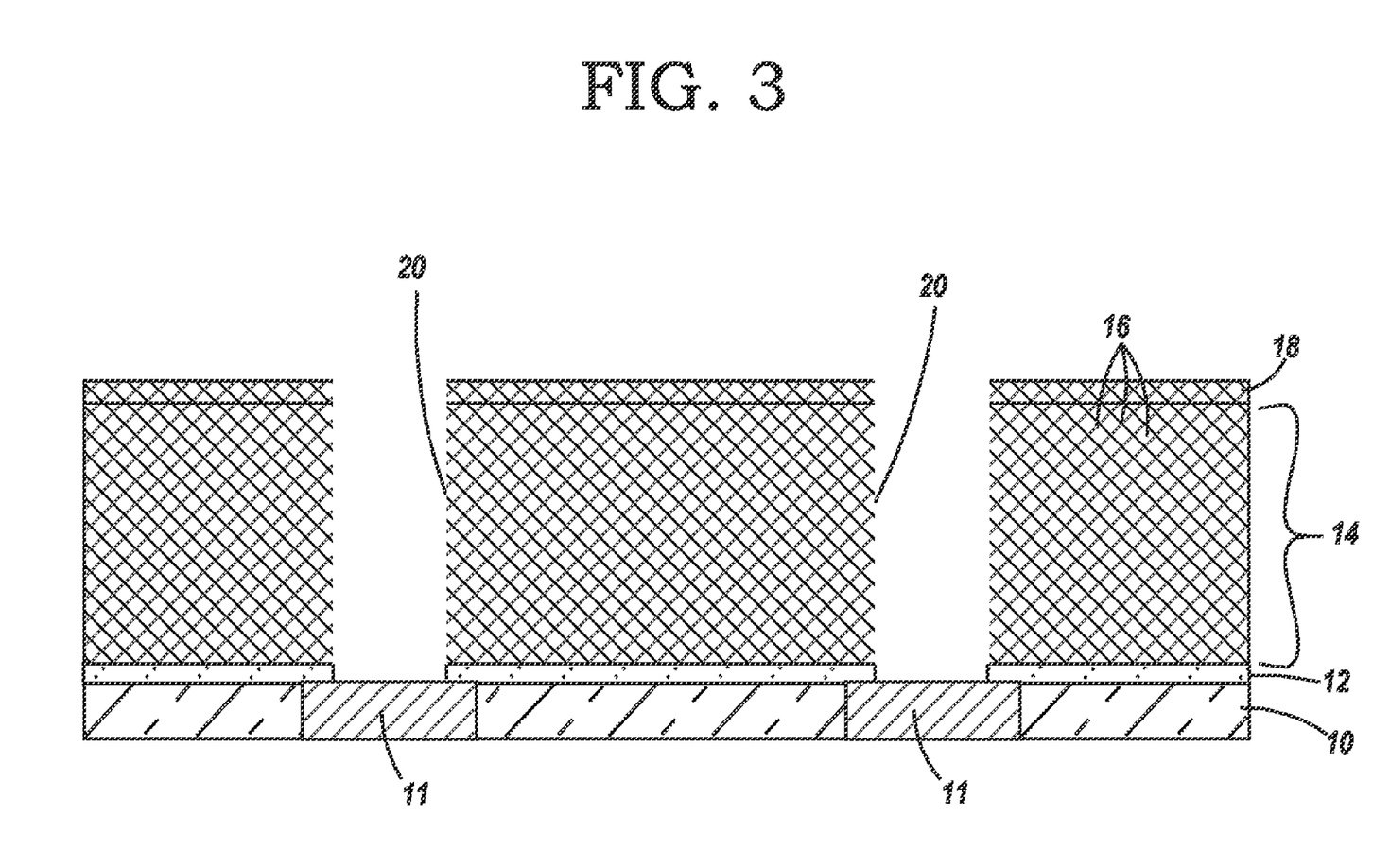

With reference to FIG. 3 in which like reference numerals refer to like features in FIG. 2 and at a subsequent fabrication stage, openings 20 characteristic of a pattern of vias and trenches are formed in cap layer 18 and the dielectric layer 14. The openings 20 are defined using conventional lithography, including applying a photoresist to a surface of the cap layer 18 and patterning the photoresist, and then etching using the patterned photoresist. Suitable etching processes include any conventional dry etching process, such as reactive-ion etching and plasma etching. The etching process stops vertically on the cap layer 12. However, the invention does not require that all of the openings 20 formed across the substrate 10 extend to the depth of the cap layer 12.

The openings 20 of the pattern may include, for example, an interconnect structure of features, such as vias and trenches, that are filled with a conductive material and thereby coupled with underlying conductive features (not shown), such as metallization lines or underlying circuit elements previously formed in the substrate 10. The interconnect structure may be, for example, a damascene structure or a double damascene structure but the invention is not so limited. The pattern can include any desired pattern of trenches, vias and other features conventionally designed into such interconnect structures as demanded by design requirements.

If the carbon nanotubes 16 have not been previously converted to an insulating electronic state, the openings 20 afford access for performing the conversion at this stage of the fabrication process. More specifically, fluorination gas vertically accesses the full thickness of the dielectric layer 14 through the openings 20 and diffuses laterally through the dielectric layer 14.

Figure 4:
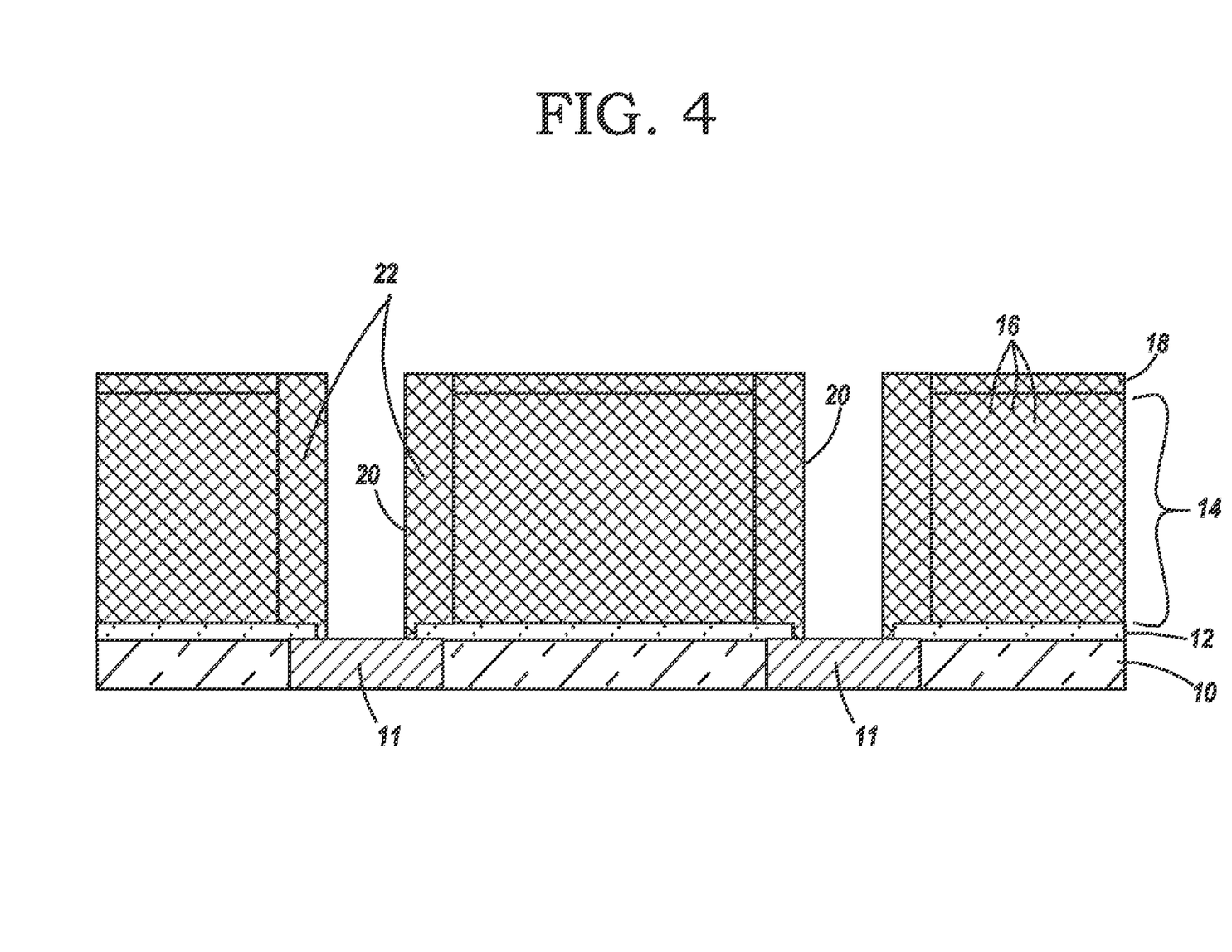

With reference to FIG. 4 in which like reference numerals refer to like features in FIG. 3 and at a subsequent fabrication stage, the carbon nanotubes 16 of dielectric layer 14 bordering the vertical sidewalls of openings 20 are sealed with a layer 22 of a diffusion limited dielectric, like $Si_3N_4$ or silicon dioxide ($SiO_2$). Dielectric layer 22 prevents migration of metal from the subsequent contacts formed in openings 20 into the dielectric layer 14. The dielectric layer 22 may be formed, for example, by a chemical vapor deposition (CVD) process. The dielectric layer 22 may have a vertical boundary that is substantially coplanar with the vertical sidewalls of openings 20, as shown in FIG. 4. Alternatively, dielectric layer 22 may partially or totally cover the vertical sidewalls of openings 20. A directional dry etch process, such as RIE, is used to remove portions (not shown) of the dielectric layer 22 from the horizontal floor of each opening 20.

Figure 5:
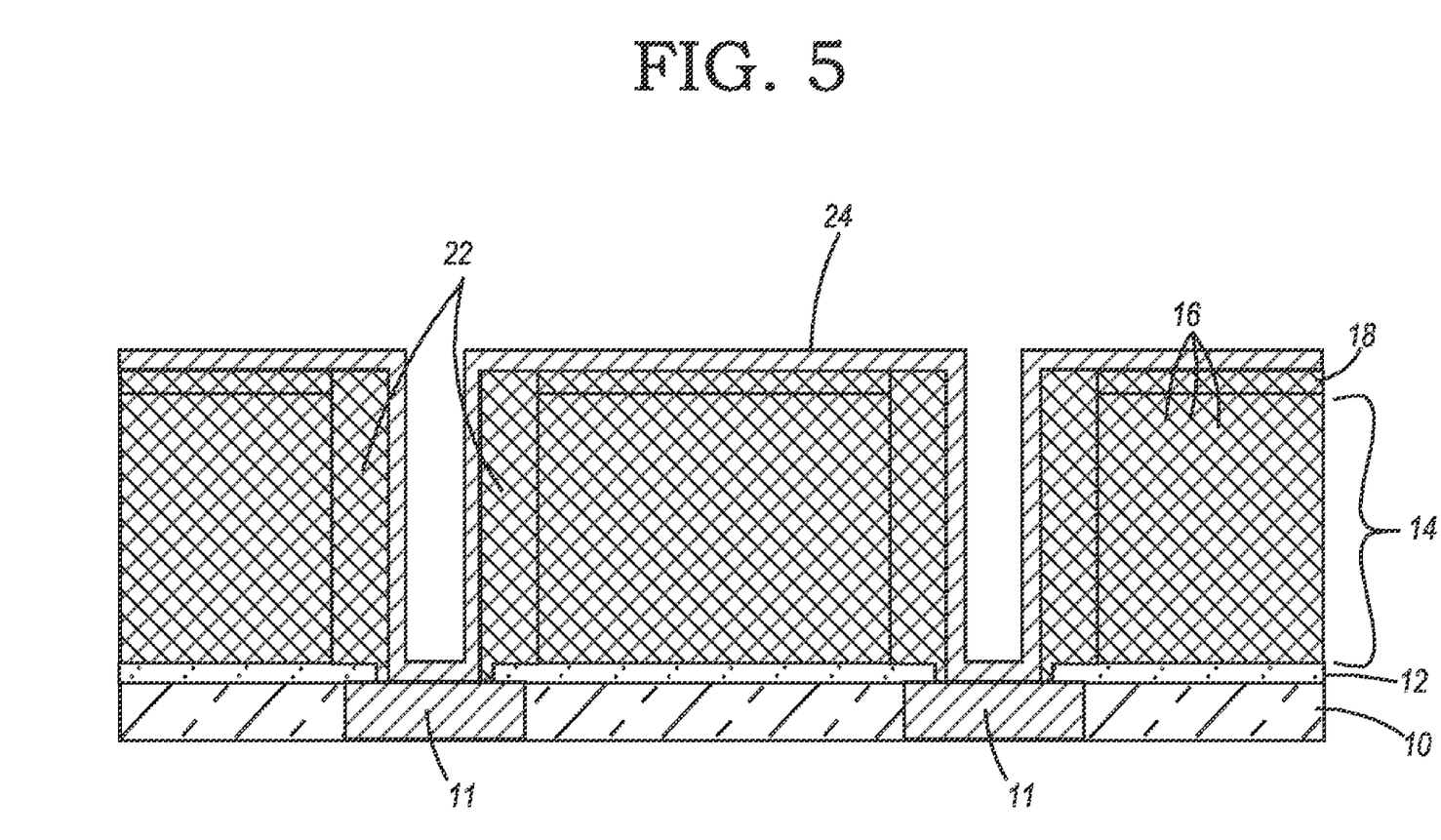

With reference to FIG. 5 in which like reference numerals refer to like features in FIG. 4 and at a subsequent fabrication stage, an optional but preferred liner 24 is applied to the exposed vertical and horizontal surfaces of the openings 20. Liner 24 is typically comprised of one or more layers of tantalum (Ta), titanium (Ti), tungsten (W), or nitrides of these metals. The liner material of liner 24 may be formed in the openings 20 utilizing conventional deposition processes well known to persons of ordinary skill in the art, including but not limited to CVD, plasma-enhanced CVD, and physical vapor deposition (PVD). The process applying the liner 24 inside openings 20 may also cover cap layer 18 with excess liner material that is subsequently removed.

Figure 6:
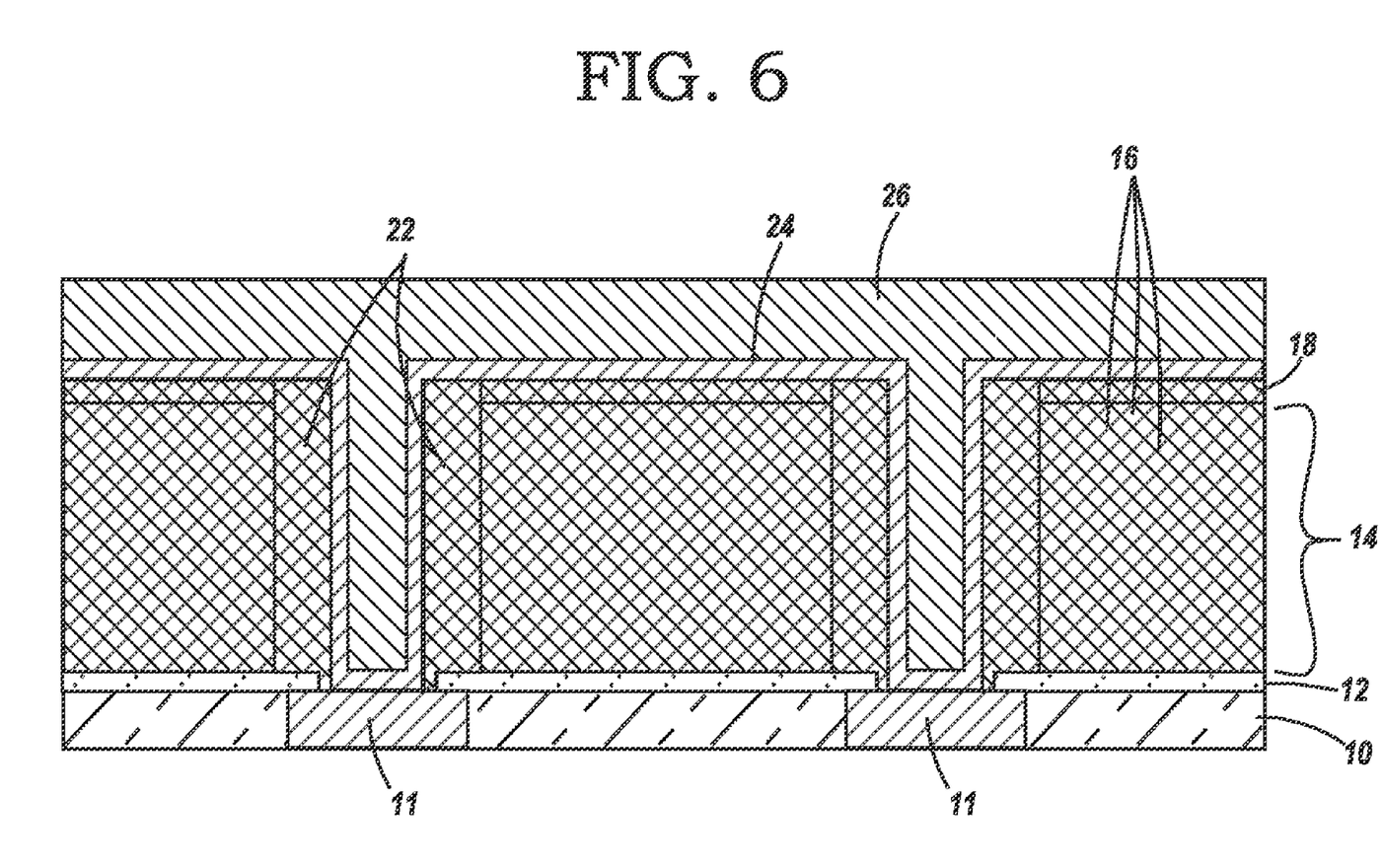

With reference to FIG. 6 in which like reference numerals refer to like features in FIG. 5 and at a subsequent fabrication stage, a layer of a conductor 26 is deposited across the substrate 10 so that the openings 20 (FIG. 3) are filled by conductive material. The conductive material may be a metal that will serve as contacts with the metal conductive lines of underlying circuit elements or devices previously formed in the substrate 10 and as metal conductive lines. The optional liner 24, along with the dielectric layer 22, separate the dielectric layer 14 from portions of the conductor layer 26 filling openings 20. Suitable conductors include but are not limited to aluminum (Al), copper (Cu), tungsten (W), silver (Ag), alloys of these metals, and other like metals. The metal is formed in the openings 20 utilizing a conventional deposition process such as CVD, plasma-enhanced CVD, an electrochemical process such as electroplating or electroless plating, PVD, direct current (DC) or radio frequency (RF) sputtering, and the like.

Figure 7:
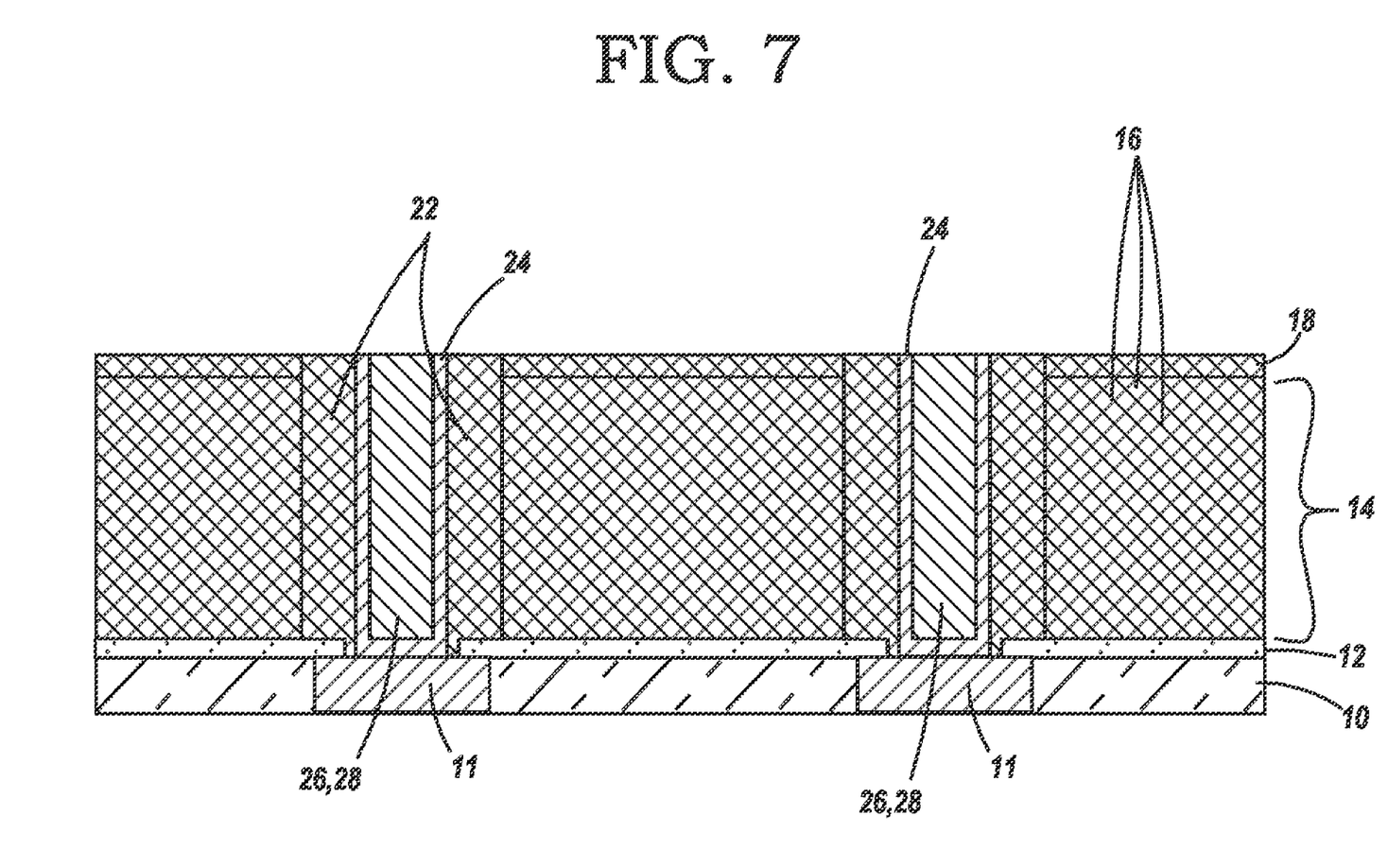

With reference to FIG. 7 in which like reference numerals refer to like features in FIG. 6 and at a subsequent fabrication stage, the top surface of conductor layer 26 is made substantially coplanar with the upper horizontal surface of cap layer 18, usually by a CMP process, to define individual conductive features or contacts 28 inside openings 20. The CMP process combines abrasion and dissolution to flatten and smoothen the surface relief. Abrasion occurs when higher portions of the conductive layer 26 contact a polish pad and abrasive particles in a polish slurry and become subject to mechanical forces. Dissolution occurs when conductive material at the exposed surface of layer 26 contacts chemicals in the slurry and becomes susceptible to chemical or electrochemical reactions. The planarization removes the overburden of excess conductive material from layer 26 and portions of the optional liner 24 covering the cap layer 12 outside of openings 20 (FIG. 4).

The cap layer 18 remains on the surface of the interconnect structure after planarization. For this reason, the dielectric constant of the cap layer 18 should be relatively low so as to not significantly increase the effective dielectric constant of the dielectric layer 14. Accordingly, the dielectric layer 14 and the cap layer 18 should collectively have a dielectric constant of less than about three (3). However, in certain embodiments, the dielectric layer 14 alone has a dielectric constant of about three (3) with the presence of the cap layer 18 resulting in an effective dielectric constant marginally greater than about three (3). After planarization, an upper horizontal surface of each conductive contact 28 is approximately flat and level with the upper horizontal surface of cap layer 12 across the substrate 10.

The completed interconnect structure of FIG. 7 is reproduced or replicated across the surface of substrate 10 by the fabrication procedure described in FIGS. 1-7 to define an interconnect level. Additional interconnect levels, similar or identical to the completed interconnect level, may be stacked above the completed interconnect level by following a fabrication process identical or similar to that illustrated in FIGS. 1-7. The invention contemplates that access passages (not shown) may be provided in such multilevel interconnect structures for converting the constituent carbon nanotubes 16 to an insulating electronic state after all levels are formed. For example, a fluorination gas may be routed to the dielectric layer 14 of the various levels through the access passages. Regardless of the processing stage at which the conversion of carbon nanotubes 16 to an insulating electronic state occurs, the temperature of the substrate 10 after conversion and during subsequent processing stages should not exceed a temperature that would otherwise degrade the electrical insulating properties of the converted carbon nanotubes 16.

The spin-coating process offers benefits of a low-temperature process and simplicity. However, the carbon nanotubes 16 of dielectric layer 14 may be formed by other techniques. For example, the carbon nanotubes 16 may be grown using any suitable growth technique, as described below.

Figure 8:
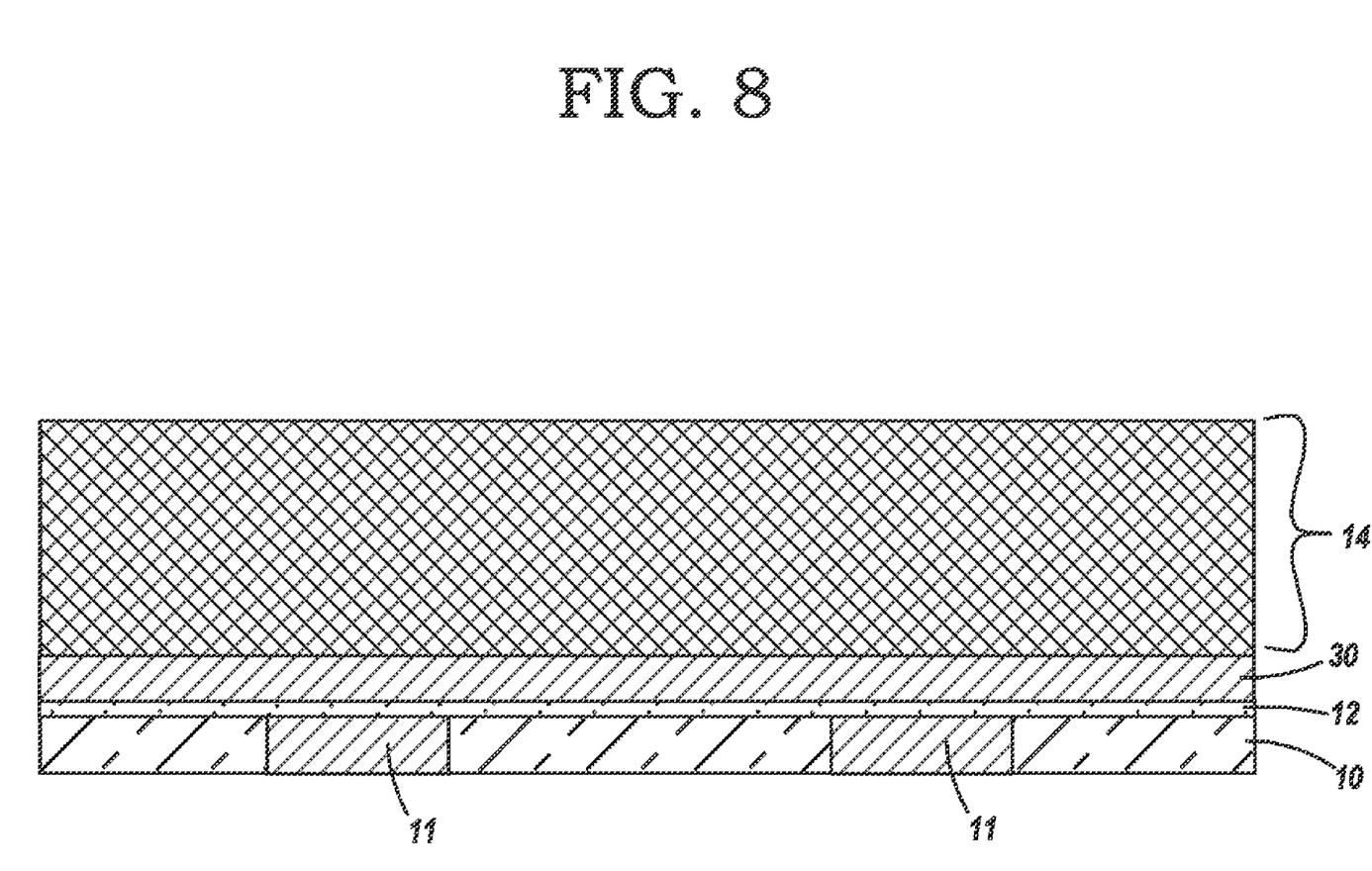
FIG. 8 is a diagrammatic cross-sectional view similar to FIG. 1 of a portion of a substrate at an initial processing stage in accordance with an alternative embodiment of the invention.

With reference to FIG. 8 in which like reference numerals refer to like features in FIG. 1 and in accordance with an alternative embodiment of the invention, the carbon nanotubes 16 may be grown by a CVD process or a plasma-enhanced CVD process. To that end, a thin layer 30 of a catalyst is formed on the cap layer 12. The catalyst layer 30 may include any material capable of nucleating and supporting the synthesis or growth of carbon nanotubes 16 when exposed to appropriate reactants under chemical reaction conditions suitable to promote nanotube growth. Suitable catalyst materials for catalyst layer 30 include, but are not limited to, iron (Fe), nickel (Ni), cobalt (Co), compounds of these metals such as metal oxides, and alloys of these metals. In the case of metal oxides, it may be necessary to perform a reduction to access or activate the catalyst material. The catalyst layer 30 is formed by depositing the catalytic material by any conventional deposition technique including, but not limited to, a CVD process or plasma-enhanced CVD process, DC or RF sputtering, and PVD.

The catalyst layer 30 catalyzes the growth of carbon nanotubes 16 from a carbon-containing reactant gas when contacted by the reactant gas under appropriate growth conditions. Suitable carbon-containing reactant gases for such catalyzed nanotube growth include, but are not limited to, carbon monoxide and hydrocarbon precursors. The hydrocarbon precursor may be an aromatic hydrocarbon, such as benzene, toluene, xylene, cumene, ethylbenzene, naphthalene, phenanthrene, anthracene, and their mixtures. Alternatively, the hydrocarbon precursor may be a non-aromatic hydrocarbon, such as methane, ethane, propane, ethylene, propylene, acetylene, and their mixtures, or an oxygen-containing hydrocarbon, such as methanol, ethanol and other alcohols, acetone and other ketones, formaldehyde, acetaldehyde and other aldehydes, and their mixtures. Other suitable reactant gases include a mixture of carbon monoxide and hydrogen, a mixture of acetylene and ammonia, a mixture of acetylene and hydrogen, and a mixture of ethanol and nitrogen.

The catalyst layer 30 promotes carbon nanotube synthesis by reducing the activation energy of the reaction with the carbon-containing reactant gas forming carbon nanotubes 16. Carbon atoms originating from the reactant gas are incorporated into the lengthening carbon nanotubes 16. Substrate 10 may be heated to a temperature adequate to promote and/or hasten CVD growth. The carbon nanotubes 16 will tend to grow vertically from the catalyst layer 30. Growth is halted when the carbon nanotubes 16 have a desired height. The carbon nanotubes 16 grow on substrate 10 in either a semiconducting or conducting electronic state and are converted to an insulating electronic state by, for example, fluorination or hydrogenation as described herein. Conversion of the carbon nanotubes 16 by fluorination would also fluorinate the remaining portions of catalyst layer 30 to produce a metal fluoride.

After the carbon nanotubes 16 are grown, processing of substrate 10 continues as described herein with regard to FIGS. 1-7 to form the completed interconnect structure shown in FIG. 7. Of course, it is understood by person of ordinary skill that, after the carbon nanotubes 16 are formed, the catalyst layer 30 is converted to a nonconductive form by, for example, oxidation or fluorination.

Figure 9:
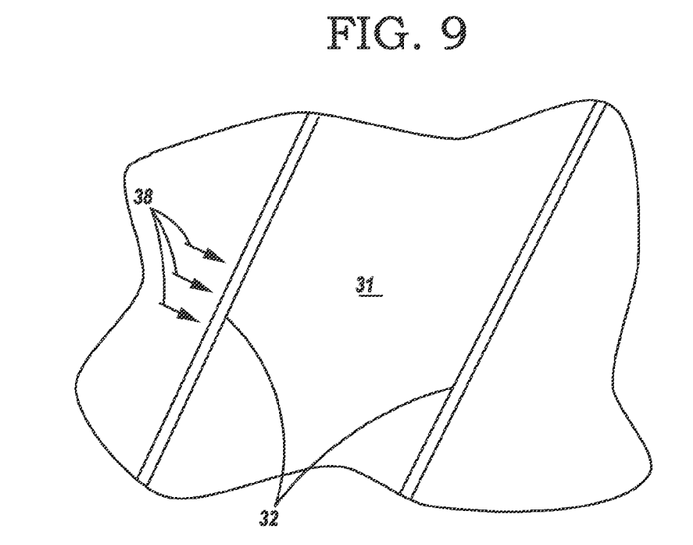
FIG. 9 is a diagrammatic view of a portion of a substrate having mandrels configured to grow carbon nanotubes to form the dielectric layer of FIG. 1 in accordance with another alternative embodiment of the invention.
Figure 9A:
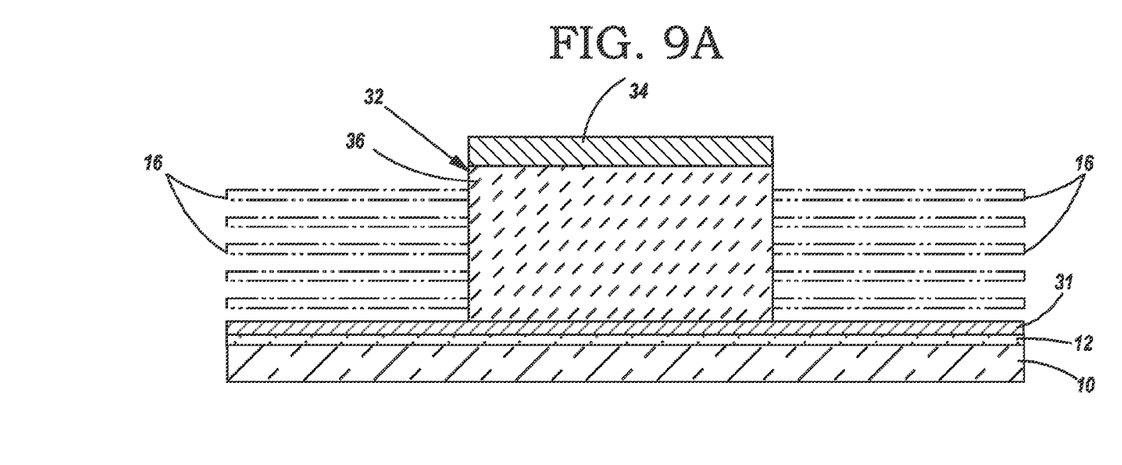
FIG. 9A is an enlarged diagrammatic cross-sectional view detailing one of the mandrels shown in FIG. 9.

With reference to FIGS. 9 and 9A in which like reference numerals refer to like features in FIG. 1 and in accordance with an alterative embodiment of the invention, the dielectric layer 14 may be formed by another approach. Specifically, a thin layer 31 of a material that does not support the growth of carbon nanotubes 16 is deposited across substrate 10 on the cap layer 12 and an oxide layer having a thickness in the range of about 200 nm to about 800 nm is formed on layer 31. Then, a thin layer 34 of a material that does not support the growth of carbon nanotubes 16 is deposited on the oxide layer. Layers 31 and 34 may be formed from materials such as silicon, tungsten, titanium, zirconium, hafnium, and aluminum, and may have a thickness in the range of about 10 nm to about 20 nm.

A plurality of parallel mandrels 32 are formed from the oxide layer on the metal layer 31 using a conventional lithography and etch process that removes patterned portions of the oxide layer and layer 34. Adjacent parallel mandrels 32 in the pattern may be separated, for example, by about 300 microns to about 1000 microns. After etching, an upper horizontal surface of an oxide body 36 of each mandrel 32 is covered by a residual cap that represents residual material left after etching layer 34 and the vertical sidewalls of the oxide body 36 are exposed oxide. This structure is best shown in FIG. 9A. The remaining material of layers 31 and 34 may be rendered non-conducting, after the carbon nanotubes 16 are grown, by either fluorinating simultaneously with the fluorination of the carbon nanotubes 16 or oxidizing with either oxygen or ozone at a low temperature that does not cause significant oxidation of the carbon nanotubes 16.

Carbon nanotube growth is initiated by a CVD process that supplies a flow of a gas mixture of a catalyst vapor or gas, such as ferrocene ($Fe(C_5H_5)_2$), and a carbon-containing vapor of gas, such as xylene ($C_6H_4(CH_3)_2$), that is directed approximately horizontally across the surface of substrate 10, as generally indicated by the arrows labeled with reference numeral 38. The layers 31 and 34 do not support carbon nanotube growth. However, the reactant gas reacts with the catalyst atoms deposited from the catalyst gas on the exposed vertical sidewalls of the oxide body 36 to nucleate and grow carbon nanotubes 16. The presence of the catalyst gas in the gas mixture permits nucleation and growth of carbon nanotubes 16 without incorporating a metal nucleating layer 30 (FIG. 8) into the interconnect structure. During the chemical vapor decomposition, metal atoms from the catalyst gas in the gas mixture serve to nucleate the nanotubes 16 on the vertical sidewalls of the oxide body 36.

Carbon nanotubes 16 grow outwardly from the sidewalls with a substantially horizontal orientation that extends approximately laterally across the substrate surface, as shown in dashed lines in FIG. 9A. The CVD process is sustained to continue nanotube growth until the length of carbon nanotubes 16 is suitable for forming the dielectric layer 14. The carbon nanotubes 16 grow on substrate 10 in either a semiconducting or conducting electronic state and are converted to an insulating electronic state by, for example, fluorination or hydrogenation as described herein. A dielectric layer 14 formed with carbon nanotubes 16 grown in this manner may solve the problem of thermal expansion of conventional organic materials as dielectric layer 14 is not constrained vertically, which permits expansion without the introduction of stress.

After the carbon nanotubes 16 are grown, processing of substrate 10 continues as described herein with regard to FIGS. 1-7 to form the completed interconnect structure shown in FIG. 7. Of course, it is understood by person of ordinary skill that the metal capped mandrels 32 will be present in the completed interconnect structure or may be removed, if desired, from the completed interconnect structure by a dry etch process like RIE.

References herein to terms such as "vertical", "horizontal", etc. are made by way of example, and not by way of limitation, to establish a frame of reference. The term "horizontal" as used herein is defined as a plane parallel to the conventional plane or surface of substrate 10, regardless of orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed without departing from the spirit and scope of the invention.

The fabrication of the semiconductor device has been described by a specific order of fabrication stages and steps. However, it is understood that the order may differ from that described. For example, the order of two or more steps may be altered relative to the order shown. Also, two or more steps may be carried out concurrently or with partial concurrence. In addition, various steps may be omitted and other steps may be added. It is understood that all such variations are within the scope of the invention.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method for forming an integrated circuit structure on a substrate, the method comprising:
    forming a dielectric layer comprising a plurality of carbon nanostructures and a copolymer binding the carbon nanostructures;
    forming at least one opening in the dielectric layer that includes a sidewall extending into the dielectric layer;
    covering the sidewall of the at least one opening with a dielectric material that prevents migration of a conductive material into the dielectric layer bordering the sidewall; and
    filling the at least one opening with the conductive material is separated from the dielectric layer by the dielectric material.

2. The method of claim 1 wherein forming the dielectric layer comprises:
    applying the carbon nanostructures and the copolymer on the substrate by a spin-on coating process.

3. The method of claim 1 wherein forming the dielectric layer further comprises:
    fluorinating the carbon nanostructures; and
    applying the fluorinated carbon nanostructures and the copolymer on the substrate by a spin-on coating process.

4. The method of claim 1 wherein forming the dielectric layer further comprises:
    applying the carbon nanostructures and the copolymer on the substrate by a spin-on coating process; and
    fluorinating the carbon nanostructures after application by the spin-on coating process.

5. The method of claim 1 wherein forming the dielectric layer further comprises:
    dispensing a liquid mixture comprising the carbon nanostructures, the copolymer, and a solvent onto the substrate;
    rotating the substrate to distribute the liquid mixture across the substrate by centrifugal forces and form the dielectric layer; and
    heating the dielectric layer to at least partially remove the solvent and cure the copolymer.

6. The method of claim 1 further comprising:
    covering the dielectric layer with a cap layer of a dielectric material.

7. The method of claim 6 wherein the carbon nanostructures, the copolymer layer, and the cap layer collectively have a dielectric constant of less than about 3.

8. The method of claim 1 wherein the carbon nanostructures and the copolymer layer have an effective dielectric constant of less than about 3.

* * * * *